United States Patent [19]

Tokunaga et al.

[11] 4,172,996
[45] Oct. 30, 1979

[54] SQUELCH CIRCUIT

[75] Inventors: Tadatsugu Tokunaga; Akira Fujii, both of Tokyo, Japan

[73] Assignee: Nippon Electric Co., Ltd., Tokyo, Japan

[21] Appl. No.: 879,405

[22] Filed: Feb. 21, 1978

[30] Foreign Application Priority Data

| Feb. 21, 1977 | [JP] | Japan | 52-18491 |
| Jul. 25, 1977 | [JP] | Japan | 52-99823[U] |
| Dec. 20, 1977 | [JP] | Japan | 52-153914 |

[51] Int. Cl.$^2$ ............................................. H04B 1/10
[52] U.S. Cl. .................................... 325/348; 325/478
[58] Field of Search ............... 325/348, 349, 474–476, 325/478–480; 328/162, 163, 165, 48; 307/225 R, 350, 354

[56] References Cited

U.S. PATENT DOCUMENTS

| 3,437,937 | 4/1969 | Warfield | 325/478 |
| 3,546,607 | 12/1970 | Dixon | 325/478 |
| 3,564,419 | 2/1971 | Yackish | 325/348 |
| 3,633,112 | 1/1972 | Anderson | 325/478 |
| 3,961,268 | 6/1976 | Hansen | 325/478 |
| 3,995,220 | 11/1976 | Hansen | 325/478 |

Primary Examiner—Robert L. Richardson
Assistant Examiner—Jin F. Ng
Attorney, Agent, or Firm—Sugrue, Rothwell, Mion, Zinn and Macpeak

[57] ABSTRACT

A squelch circuit for use in an angle-modulation communication receiver includes a squelch switch responsive to a control signal generated by a squelch control circuit. The squelch control circuit has a level detector for detecting a carrier level of a received signal and a decision circuit which detects the presence of impulse noise in the received signal. The output of the decision circuit is supplied to a counter for counting the number of impulse noise occurrences in a predetermined time period. The logical product of the outputs of the level detector and the counter is formed to generate the control signal for the squelch switch.

2 Claims, 21 Drawing Figures

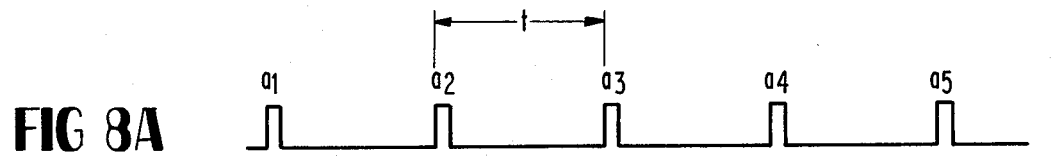
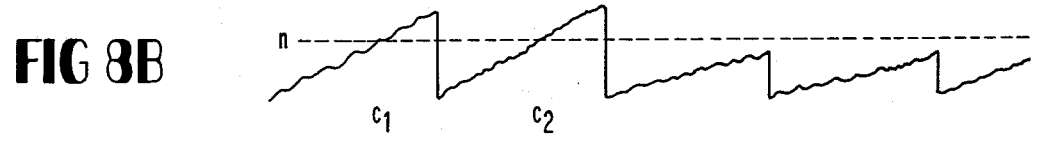
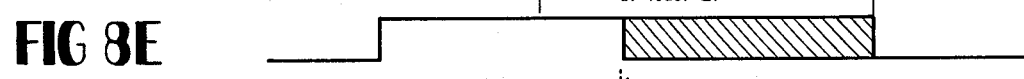
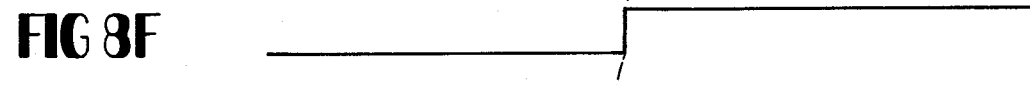
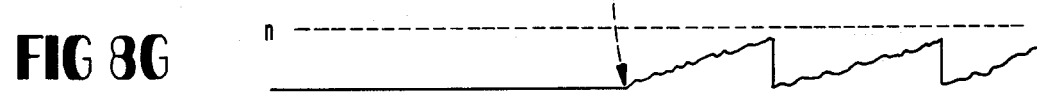
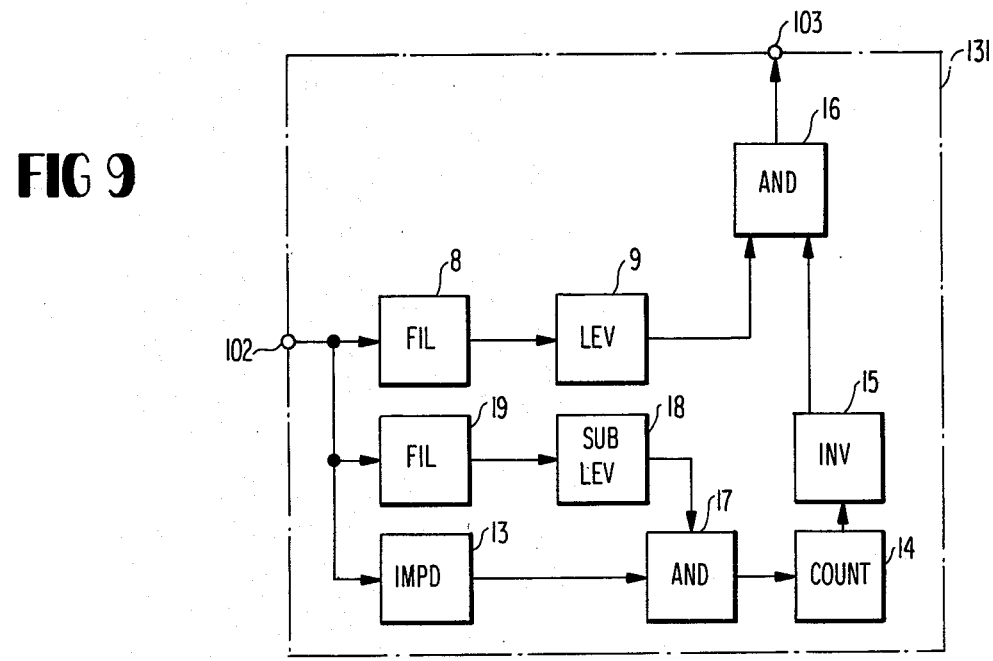

SQUELCH CIRCUIT

BACKGROUND OF THE INVENTION

The present invention relates to improvements in a squelch circuit used for the reception of angle-modulated signals.

In an angle-modulation communication system such as an FM (frequency-modulation) or a PM (phase-modulation) communication system, there is a noise suppression effect depending on the modulation index. Therefore, a fairly high signal-to-noise ratio (S/N) can be achieved for the demodulated signal. However, if the carrier power to noise power ratio (C/N) becomes small, the S/N of the demodulator output is lowered abruptly, making the normal reception of signals impossible.

Heretofore, for the purpose of resolving this problem, a squelch circuit has been employed, which comprises means responsive to the noise level for interrupting the demodulated signal to mitigate noise interference when the noise level is high.

This squelch circuit is widely used in amature radio communications or the like, and is effective for one-way communication systems. However, the precision in the level detection is low and the response time is long. For instance, in a burst signal transmission system in which a carrier wave is transmitted only during the period when a voice waveform is present, the presence or absence of a carrier wave is determined depending upon the output noise power at the receiver circuit. Accordingly, there is a disadvantage that the precision in detection is not sufficiently high, and that the speed is not high enough to follow the voice waveform.

In addition, another squelch circuit is known, in which a carrier energy band compression effect of a phase synchronizing circuit is utilized, and by effecting homodyne detection, carrier power is detected to intercept a demodulated signal and to mitigate noise interference (reference is made to U.S. Pat. No. 3,397,360). In this case, there is a disadvantage that although the carrier can be detected if the C/N is sufficiently large (experimentally, if it is about 3 dB or larger), malfunction may arise in the detection of the carrier power if the C/N becomes small.

SUMMARY OF THE INVENTION

One object of the present invention is to provide a squelch circuit, in which the aforementioned disadvantages in the prior art can be overcome, and in which noise interference can be removed even if the C/N is small, and detection response is fast.

According to one feature of the present invention, there is provided a squelch circuit comprising a squelch switch responsive to a control signal for selectively supplying a demodulated signal derived from an angle-modulated received input signal to an output circuit, first means for detecting the carrier level of the received input signal with reference to a first predetermined value, second means for detecting impulsive noise contained in the received input signal, third means for detecting the number of occurrences per unit time of the detected impulsive noise, and fourth means having a logic product function of the outputs of the first and the third means for supplying the output to the squelch switch as the control signal.

BRIEF DESCRIPTION OF THE DRAWINGS

Now the present invention will be described in greater detail with reference to the accompanying drawings, in which:

FIGS. 8A to 8G are waveform diagrams showing waveforms at various points in the circuit shown in FIG. 7; and FIG. 9 is a block diagram of still another preferred embodiment of the present invention.

In FIG. 1, reference numeral 1 designates an input terminal; 2, a phase synchronizing loop type demodulator; 3, a phase detector; 4, a loop filter; 5, a voltage-controlled oscillator; 6, a phase shifter; 7, a homodyne detector; 8, a low-pass filter; 9, a level detector; 10, a delay circuit; 11, a squelch switch; 12, an output terminal; 101, a squelch control circuit; 102, an input terminal of the squelch control circuit 101; and 103, an output terminal of the squelch control circuit 101. An FM signal supplied through the input terminal 1 is demodulated by the demodulator 2. This demodulator 2 is a conventional phase synchronizing type demodulator consisting of the phase detector 3, the loop filter 4 and the voltage-controlled oscillator 5. An output signal from the oscillator 5 is applied to the homodyne detector (for instance, a multiplier circuit) 7 through the phase shifter 6. The phase shifter 6 is so adjusted that in a steady state, the input signal at terminal 1 may be in-phase with the signal supplied from the output of the oscillator 5 through the phase shifter 6. When the C/N is sufficiently large, a sufficiently large D.C. signal that is not affected by the noise power can be obtained at the output of the low-pass filter 8 through the homodyne detector 7. This D.C. signal is detected by a level detector (for instance, a voltage comparator) 9, and when this signal is higher than a predetermined level, the detected signal appears at the output terminal 103.

Figure 1:
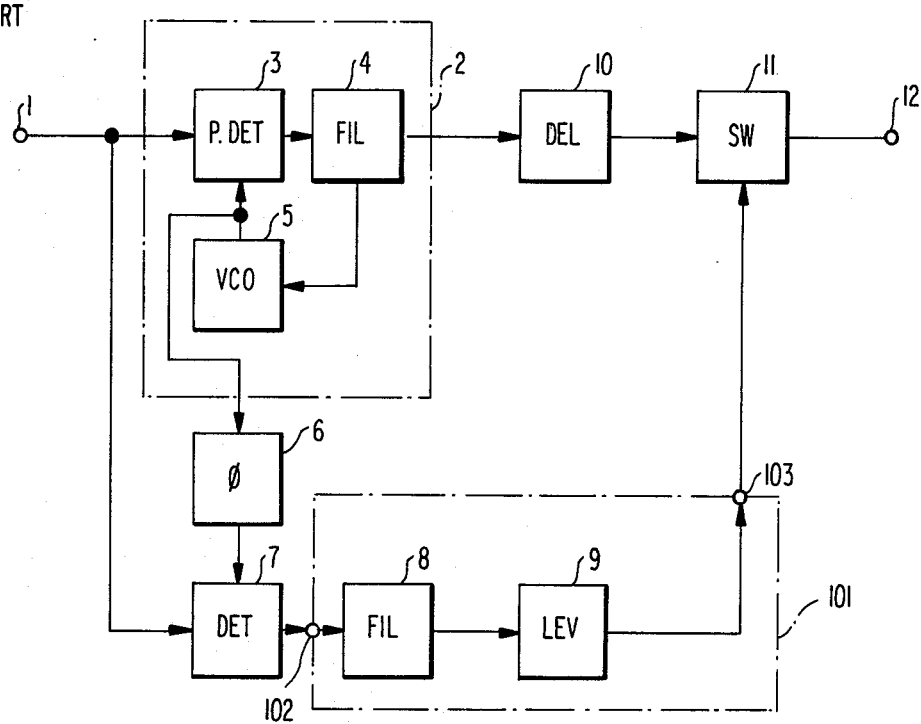
FIG. 1 is a block diagram of a conventional squelch circuit.

On the other hand, a demodulated signal derived from the demodulator 2 is fed to the squelch switch 11 through the delay circuit 10. The squelch switch 11 is controlled by the output from the level detector 9. The delay circuit 10 is provided for compensating for the delay of the control for the switch 11. In the conventional circuit shown in FIG. 1, since the process of detecting the carrier power is effected by means of an AM detector, in the case where the C/N is low (that is, in case where the carrier power level is low with respect to the noise power level), setting of the threshold level in the level detector 9 becomes critical, and if the C/N is further lowered, malfunction will occur in the carrier level detection due to interference by the noise power. Consequently, correct control of the switch 11 becomes impossible, and in the worst case, the switch 11 will not be turned OFF even under the state where the carrier input has been interrupted.

Figure 2:
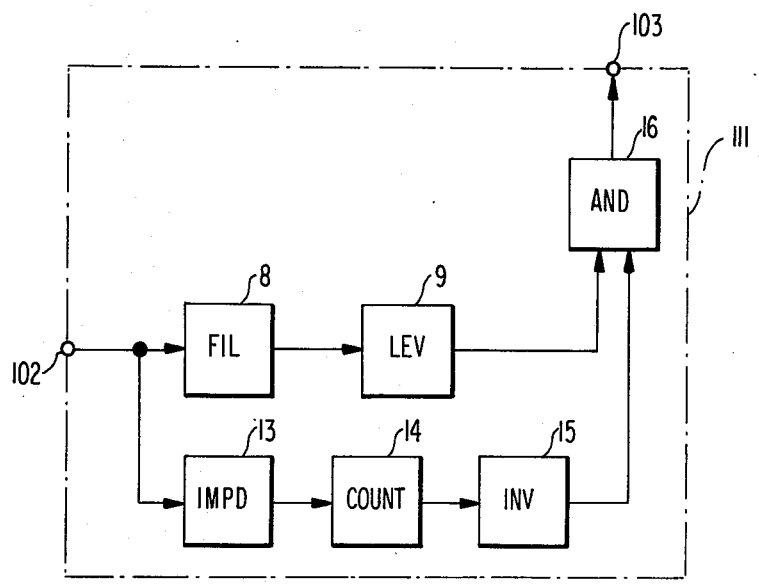
FIG. 2 is a block diagram of one preferred embodiment of the present invention.

One preferred embodiment of the present invention is shown in block form in FIG. 2. As clearly shown in the drawing, the control circuit 111 is constructed in such a manner that the output of the homodyne detector 7 (shown in FIG. 1) is branched to detect impulse noise and the switch 11 may be also controlled by this detected signal. More particularly, the output of the homodyne detector 7 is passed through a decision circuit (for instance, a Zero-level detector) 13, a counter circuit 14 and an inverter 15, and is fed to an AND gate 16 jointly with the output of the level detector 9. The logic product output of the AND gate 16 is adapted to control the switch 11.

In the apparatus constructed as described above, the detection of the impulse noise is effected in the following manner. In the demodulator 2 shown in FIG. 1, in a synchronized steady state, a phase difference of about 90 degrees is maintained between the wave at the input of the phase detector 3 and the output wave from the oscillator 5. If a deviation from 90 degrees of this phase difference is represented by $\theta$, then the output from the phase detector 3 is proportional to $\sin \theta$. In order that the synchronized state of this phase synchronizing loop can be maintained, at least the condition of $$|\theta| < \pi/2$$

must be fulfilled. Accordingly, a step out condition can be detected by knowing that the absolute value of $\theta$ has exceeded $\pi/2$, and at this moment it is determined that impulse noise has occurred. To this end, the output wave of the oscillator 5 is shifted in phase by 90 degrees in the phase shifter 6 so that it may become in-phase with the input signal wave in the homodyne detector 7 which multiplies these waves to produce a voltage proportional to $\cos \theta$ at the output of the homodyne detector 7. If one can determine whether this voltage is positive or negative, then it is possible to detect presence of the impulse noise. The decision circuit 13 in FIG. 2 detects whether the output of the homodyne detector 7 is positive or negative. The output signal from this decision circuit 13 is fed to the counter circuit 14 to count the number of occurrences of the impulse noise within a predetermined period of time, and when the count exceeds a predetermined value, an output signal is emitted. The counter circuit 14 further includes a circuit in which the counted signal is converted in a level and a time width so that it can control the switch 11 through the inverter 15. By taking a logic product of the output signal of the inverter 15 and the output signal of the level detector 9 in the AND gate 16, the switch 11 can be controlled in such a manner that only when the carrier power of the input signal is sufficiently large and also the impulse noise is smaller than a predetermined power level, the switch 11 may pass the demodulated signal from the demodulator 2.

Figure 3:
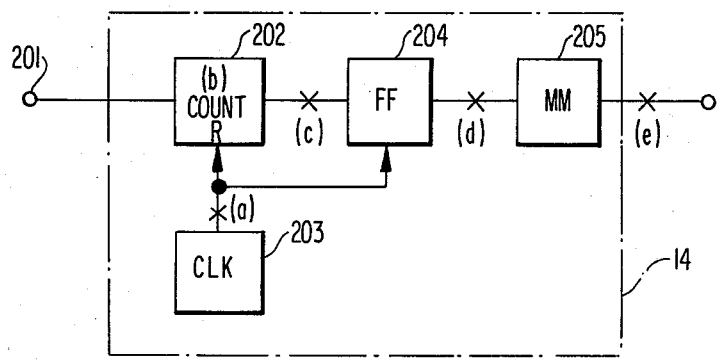
FIG. 3 is a block diagram of one example of an impulsive noise counter circuit employed in FIG. 2.
Figure 4A:
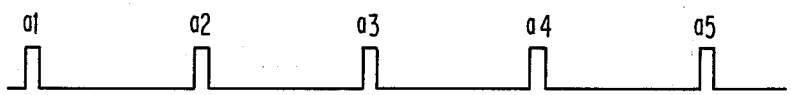
FIGS. 4A to 4E are waveform diagrams showing waveforms at various points in the circuit shown in FIG. 3.
Figure 4B:
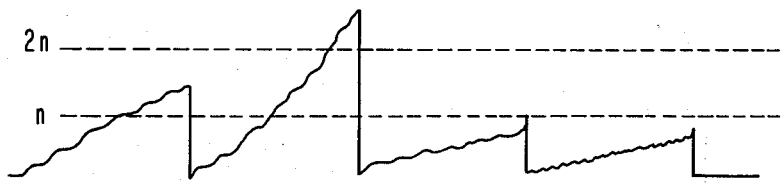
Figure 4C:
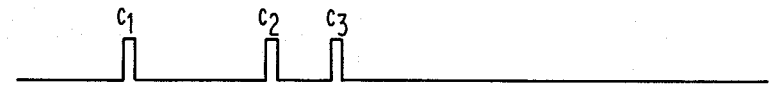
Figure 4D:
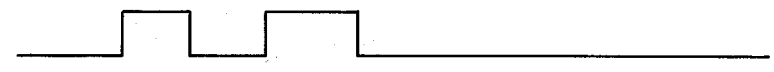

Now a more detailed construction of the counter circuit 14 will be described with reference to FIG. 3 which shows one example of the counter circuit 14. A waveform diagram is shown in FIGS. 4A to 4E in which waveforms appearing at points (a) to (e) in the circuit shown in FIG. 3 are respectively represented. In FIG. 3, reference numeral 201 designates an input terminal to which the signal derived from the decision circuit 13 is incoming. A pulse counter 202 emits one pulse at its output in response to every n pulses incoming to the input terminal 201. The pulse counter 202 is adapted to be reset by an output pulse as shown in FIG. 4A of a clock pulse generator 203 which oscillates with a predetermined period. The count in the pulse counter 202 is shown in FIG. 4B. The pulse counter is an n-step counter which emits a pulse at its output when every n pulses have been counted. An output state of this pulse counter 202 is shown in FIG. 4C. More particularly, when the number of the impulses has reached n in between the clock pulses $a_1$ and $a_2$, an output pulse $c_1$ is derived. If the number of impulses is greater, then a pulse is generated for every n pulses, such as a pulse $c_2$ or $c_3$. If the count does not reach n during one period of the clock pulses, then an output pulse will not be generated by the pulse counter 202. The output of the pulse counter 202 is connected to one input terminal of a flip-flop (FF) 204. To the other input terminal of the FF 204 is connected the clock pulse generator 203. As shown in FIG. 4D, the output of this FF 204 rises in response to the pulses $c_1$ and $c_2$ and falls in response to the next subsequent clock pulses $a_2$ and $a_3$, respectively.

Figure 4E:

The output of the FF 204 is fed to a mono-stable multivibrator (MM) 205. This MM 205 is used for avoiding unnecessary fluttering, and it is a retriggerable MM. The output pulse width of the MM 205 is made larger than the value twice as large as the period of the clock pulses. With reference to FIG. 4E, in the time interval where the pulses $c_1$, $c_2$, $c_3$, etc. are generated, the squelch switch 11 should be continuously kept OFF, and even after this time interval has ended, the OFF state of the switch 11 is maintained for a while in order to avoid unnecessary fluttering.

It is to be noted that the use of the FF 204 is intended to ensure that the MM 205 for obtaining a control signal for the switch 11 respond to the time positions of the pulses $c_1$ and $c_2$ as input information without responding to the time position of the second or subsequent pulse such as the pulse $c_3$ as input information, as the noise detection is effected for every time interval consisting of one period of the clock pulses.

Figure 5:
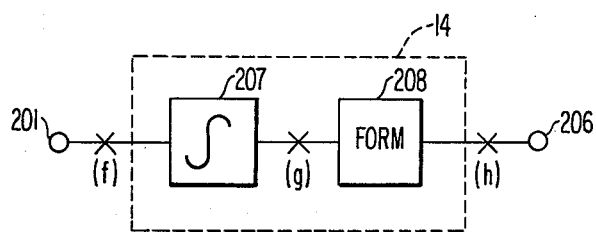
FIG. 5 is a block diagram of another example of the impulsive noise counter circuit shown in FIG. 2.
Figure 6A:
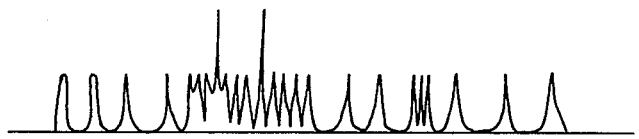
FIGS. 6A to 6C are waveform diagrams showing waveforms at various points in the circuit shown in FIG. 5.
Figure 6B:
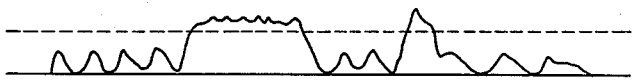
Figure 6C:
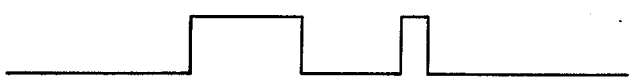

Another example of the counter circuit 14 is shown in FIG. 5, and a waveform diagram is shown in FIGS. 6A to 6C, in which waveforms appearing at points (f) to (h) in the circuit of FIG. 5 are respectively illustrated. This example of circuit arrangement is constructed in such a manner that instead of counting the number of the impulses, the impulses are accumulated by means of an integrator circuit 207, and the amount of the impulses are detected in accordance with the magnitude of a D.C. voltage. For the input impulse train illustrated in FIG. 6A, the output of an integrator circuit 207 takes the waveform shown in FIG. 6B. This D.C. level is detected by a level detector 208, and a control signal propositional to the amount of impulse noise can be derived as shown in FIG. 6C. This example of the counter circuit 14 has a characteristic feature that although the accuracy in detection is poor in contrast to the circuit shown in FIG. 3, it is possible to determine the magnitude of the impulse amount.

Figure 7:
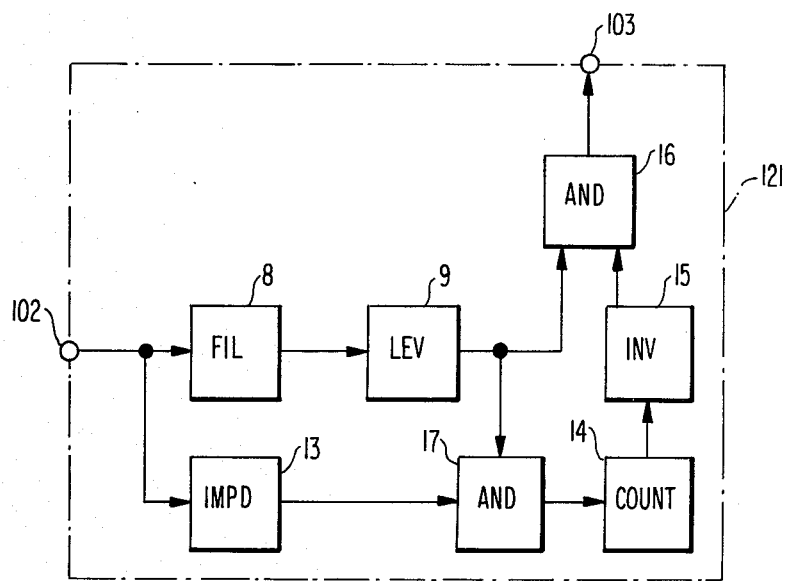
FIG. 7 is a block diagram of another preferred embodiment of the present invention.

FIG. 7 shows another preferred embodiment of the squelch control circuit 121 according to the present invention, which improves the squelch control circuit 111 of FIG. 2. FIGS. 8A to 8G are waveform diagrams showing waveforms at various points in the circuit shown in FIGS. 2 and 7 in the case where a carrier wave is inputted under a large C/N condition. The operations of the squelch control circuits 111 and 121 in case where the counter circuit 14 in FIG. 3 is used in the circuits shown in FIGS. 2 and 7, respectively, will be explained with reference to FIGS. 8A to 8G.

At first, the operation of the circuit shown in FIG. 2 will be described with reference to the waveforms shown in FIGS. 8A to 8F. In the case where the C/N is large, when the carrier is absent, only the noise is amplified by an automatic gain control circuit (AGC) (not shown) provided in the preceding stage of the squelch circuit and is fed to the input terminal 102. Consequently, even for the same C/N, the noise becomes larger than when the carrier is present, so that the count in the pulse counter 202 (in FIG. 3) exceeds n per each unit of time. Accordingly, every time the count of the impulse noise reaches n as shown in FIG. 8B, the pulse counter 202 delivers pulses $c_1$ and $c_2$ as shown in FIG. 8C. In response to these pulses $c_1$ and $c_2$, the output of the FF 204 (in FIG. 3) rises at the time positions of the pulses $c_1$ and $c_2$ and falls at the time positions of the next subsequent clock pulses $a_2$ and $a_3$ as shown in FIG. 8D. Furthermore, in response to the output of the FF 204, the output of the MM 205 (in FIG. 3) rises at the time position of the pulse $c_1$, and it falls after it has held the higher level for a period at least twice as large as the period t of the clock pulses, as shown in FIG. 8E. Under such a large C/N condition, if a carrier detected in the level detector 9 is applied at the timing $i_1$ shown in FIG. 8F, then the count of the pulse counter 202 will not exceed n as shown in FIG. 8B, because the amplification degree of the AGC for the noise is lowered. However, the output of the MM 205 (in FIG. 3) is held at its higher level for at least 2t after its rise at the time position of the pulse $c_2$ as shown in FIG. 8E. Consequently, within the time period represented by the hatched waveform portion shown in FIG. 8E, the squelch switch 11 is kept OFF despite the fact that the inputted signal has been demodulated, causing the mutilation of the leading portion of the speech signal.

When the carrier is absent under the large C/N state, the output of the level detector 9 gives the decision of the carrier-absence as shown in FIG. 8F. During this period, in the squelch control circuit 121 shown in FIG. 7, no input pulse is applied to the counter circuit 14 because a logic product of the output from the level detector 9 and the output from the decision circuit 13 is applied by AND gate 17 to the pulse counter 202 (in FIG. 3) of the counter 14, and so, no count is made in the pulse counter 202 as shown in FIG. 8G. Accordingly, the outputs of the FF 204 and the MM 205 are both held at a zero level. Under such a large C/N condition, if a carrier wave is applied at the timing $i_1$ as shown in FIG. 8F, then the level detector 9 gives the decision of carrier-presence, so that the pulse counter 202 in the counter circuit 14 starts counting the input pulses as shown in FIG. 8G. However, since the amplification degree of the AGC for the noise is lowered as described above, the count in the pulse counter 202 will not exceed n. Accordingly, the outputs of the FF 204 and the MM 205 hold a zero level, so that the squelch switch 11 is turned ON immediately after the carrier has been detected. As described above, in the preferred embodiment shown in FIG. 7, even if a carrier wave is applied and demodulated under the condition that the C/N is large and the carrier is absent, the squelch switch 11 can be controlled without causing the mutilation at the leading portion of the speech signal.

Referring to FIG. 9 showing still another embodiment, a sub-level detector 18 in this squelch control circuit 131 begins to operate at a C/N (experimentally 3–4 dB) that is larger than the C/N at which the level detector 9 begins to operate. This sub-level detector 18 operates to determine that a carrier is present at a noise level of such degree that the counter circuit 14 can count the impulse noise exceeding a predetermined amount within a given period (in other words, it opens the AND gate 17). It is to be noted that the C/N at which the level detector 9 begins to operate in response to noise is experimentally 2–3 dB. In the squelch control circuit 131 shown in FIG. 9, in the case where the C/N is small (in the illustrated example, 3–4 dB), even if the level detector 9 momentarily determines that a carrier is present despite its absence, the squelch switch 11 will not malfunction even momentarily. This is due to the fact that the impulse noise has been already counted in the counter circuit 14 since the AND gate 17 is opened by the outpout of the sub-level detector 18 and a signal of noise-presence has been applied to the inverter 15. It is to be noted that while the output of a filter 19 is supplied to the sub-level detector circuit 18, alternatively the output of the filter 8 could be applied to the input of the sub-level detector 18.

As described above, according to the present invention, since two different kinds of information of different nature are employed as control signals for the squelch switch, that is, since the control is effected depending on the presence and absence of the carrier power and on the presence and absence of impulse noise exceeding a predetermined amount, an improved squelch circuit can be obtained in which accuracy in the detected level is high, malfunction scarcely occurs and also response is fast even if the C/N is low (2–3 dB). Still further, the front-edge mutilation of speech signal under the large C/N state is prevented. Furthermore, in case where the C/N is low (3–4 dB), by employing a sub-level detector the squelch switch is prevented from malfunctioning even if the level detector momentarily determines that a carrier is present.

Further it is to be noted that while the above preferred embodiments have been described assuming that a phase synchronization type demodulator is employed, the invention can be likewise practiced by employing a limiter-discriminator or other demodulators. In addition, the present invention is not limited to an FM system but it can be likewise practiced more widely in angle-modulation communication systems.

What is claimed is:

1. A squelch circuit comprising a squelch switch responsive to a control signal for selectively supplying a demodulated signal derived from an angle-modulated received input signal to an output circuit, first means for detecting a carrier level of said received input signal with reference to a predetermined value, second means for detecting impulse noise contained in said received input signal, first AND-gate responsive to the outputs of said first and second means for selectively transmitting therethrough the detected impulse noise under control of the output of said first means, third means coupled to the output of said first AND-gate for detecting the number of occurrences per unit time of the detected impulse noise, and second AND-gate responsive to the outputs of said first and third means for supplying the output thereof to said squelch switch as said control signal.

2. A squelch circuit comprising a squelch switch responsive to a control signal for selectively supplying a demodulated signal derived from an angle-modulated received input signal to an output circuit, first means for detecting a carrier level of said received input signal with reference to a first predetermined value, second means for detecting impulse noise contained in said received input signal, third means for detecting said carrier level with reference to a second predetermined value smaller than said first predetermined value, first AND-gate responsive to the outputs of said second and third means for selectively transmiting therethrough the detected impulse noise under control of the output of said third means, fourth means coupled to the output of said first AND-gate for detecting the number of occurrences per unit time of the detected impulse noise, and second AND-gate responsive to the outputs of said first and fourth means for supplying the output thereof to said squelch switch as said control signal.

* * * * *